(12) United States Patent
Chiang et al.

(10) Patent No.: US 7,487,315 B2
(45) Date of Patent: Feb. 3, 2009

(54) ACCESSING APPARATUS CAPABLE OF REDUCING POWER CONSUMPTION AND ACCESSING METHOD THEREOF

(75) Inventors: Chin-Yi Chiang, Taipei (TW); Wallace Huang, Taipei (TW)

(73) Assignee: VIA Technologies, Inc., Taipei (TW)

( * ) Notice: Subject to any disclaimer, the term of this patent is extended or adjusted under 35 U.S.C. 154(b) by 233 days.

(21) Appl. No.: 11/466,131

(22) Filed: Aug. 22, 2006

(65) Prior Publication Data
US 2007/0058477 A1   Mar. 15, 2007

(30) Foreign Application Priority Data
Sep. 14, 2005   (TW)   .............. 94131706 A

(51) Int. Cl.
*G06F 12/00*   (2006.01)
(52) U.S. Cl. .................................... 711/167
(58) Field of Classification Search .............. None
See application file for complete search history.

(56) References Cited

U.S. PATENT DOCUMENTS 5,883,853 A * 3/1999 Zheng et al. ............. 365/233.1
6,340,904 B1 * 1/2002 Manning ................... 327/156
6,414,535 B1 * 7/2002 Ooishi ....................... 327/538
7,274,185 B2 * 9/2007 Kim ........................ 324/76.61
2004/0104753 A1 * 6/2004 Haraguchi et al. ......... 327/291

FOREIGN PATENT DOCUMENTS

CN    1485858    3/2004

OTHER PUBLICATIONS

English Abstract of CN1485858A.
* cited by examiner

*Primary Examiner*—Hiep T Nguyen
(74) *Attorney, Agent, or Firm*—Thomas, Kayden, Horstemeyer & Risley

(57) ABSTRACT

An accessing apparatus capable of reducing power consumption and an accessing method thereof are provided. The accessing method is applied in the accessing apparatus and a host. Firstly, the accessing apparatus is enabled to transmit an external data with the host according to an external clock, and transmit an internal data corresponding to the external data inside the accessing apparatus according to an internal clock. Next, the frequency of the external clock is detected. Then, the frequency of the internal clock is adjusted to a corresponding frequency according to the frequency of the external clock. Lastly, the internal data is transmitted between a buffer and a memory unit of the accessing apparatus by using an internal clock whose frequency equals the corresponding frequency.

17 Claims, 3 Drawing Sheets

ACCESSING APPARATUS CAPABLE OF REDUCING POWER CONSUMPTION AND ACCESSING METHOD THEREOF

This application claims the benefit of Taiwan application Serial No. 94131706, filed Sep. 14, 2005, the subject matter of which is incorporated herein by reference.

BACKGROUND OF THE INVENTION

1. Field of the Invention

The invention relates in general to an accessing apparatus and an accessing method thereof, and more particularly to an accessing apparatus and an accessing method thereof capable of reducing power consumption.

2. Description of the Related Art

Current digital apparatuses such as digital camera, MP3 walkman, personal digital assistant (PDA) and mobile phone all require a large capacity for the storage and accessing of data. Typically, data are accessed via an external memory card. The user can purchase various memory cards according to the required storage and accessing capacity. However, memory card possessing the advantage of convenience in exchanging data can transmit data with a computer via a card reader.

Referring to FIG. 1, a block diagram of a conventional accessing apparatus and a host is shown. Examples of the accessing apparatus 120 include a memory card with CF, SD or MS specification. Examples of the host 110 include an apparatus such as card reader or digital camera capable of accessing a memory card. The accessing apparatus 120, when electrically connected to the host 110, transmits a data D1 with the host 110 by using an external clock C1. The accessing apparatus 120 includes a buffer 121, a memory unit 123 and an oscillator 125.

The accessing apparatus 120 transmits the external data D1 with the host 110 by using the external clock C1, and enables the memory unit 123 and the buffer 121 to access an internal data D2 by using an internal clock C2. The internal clock C2 is generated by the oscillator 125. The buffer 121 is used for temporarily storing the external data D1 and the internal data D2. The external data D1 corresponds to the internal data D2. The memory unit 223 is used for storing the internal data D2.

When the host 110 is reading/writing the accessing apparatus 120, by incorporating the transmission width of data bus of the external data D1 with the external clock C1, the external data D1 is transmitted at a corresponding external band width BW1. Likewise, the internal data D2 is transmitted by using a corresponding internal band width BW2 of the internal clock C2 of the accessing apparatus 120. The accessing apparatus 120 may go with different hosts, that is, may go with different external clocks. Typically, in the case when the frequency of the external clock provided by the host 110 is unknown to the accessing apparatus 120, the internal clock C2 of the accessing apparatus 120 is enabled to operate at the highest frequency, avoiding the occurrence of buffer overrun or buffer underrun during the transmission of data. Thus, if the host 110 uses the slower external clock C1 but the accessing apparatus 120 still uses the faster internal clock C2, the internal clock C2 will be waiting for the external clock C1 for most of the time. When the internal clock C2 is waiting for the external clock C1, the state of high frequency is maintained, thus resulting in unnecessary power consumption. Take the portable electronic apparatus for example. Since the apparatus has only limited power supply, if unnecessary power consumption can not be avoided, the lifespan of the battery will be affected, deteriorating the competitiveness of the product.

SUMMARY OF THE INVENTION

The invention provides an accessing method applied in an accessing apparatus and a host. Firstly, the accessing apparatus is enabled to transmit an external data with the host according to an external clock, and transmit an internal data between a buffer and a memory unit of the accessing apparatus according to an internal clock. The buffer temporarily stores the internal data or the external data. Next, the frequency of the external clock is detected. Then, the frequency of the internal clock is adjusted to a corresponding frequency according to the frequency of the external clock. Lastly, the internal data is transmitted between a buffer and a memory unit of the accessing apparatus by using an internal clock whose frequency equals the corresponding frequency.

The invention further provides an accessing apparatus. The accessing apparatus transmits an external data with the host by using an external clock, and transmits an internal data inside the accessing apparatus by using an internal clock. The accessing apparatus includes a buffer, a memory unit and a frequency detecting circuit. The buffer is used for temporarily storing the external data or the internal data. The internal data corresponds to the external data. The memory unit stores the internal data, and transmits the internal data with the buffer by using the internal clock. The frequency detecting circuit is used for adjusting the frequency of the internal clock to a corresponding frequency. The internal data is transmitted between the buffer and the memory unit by using the internal clock whose frequency equals the corresponding frequency.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
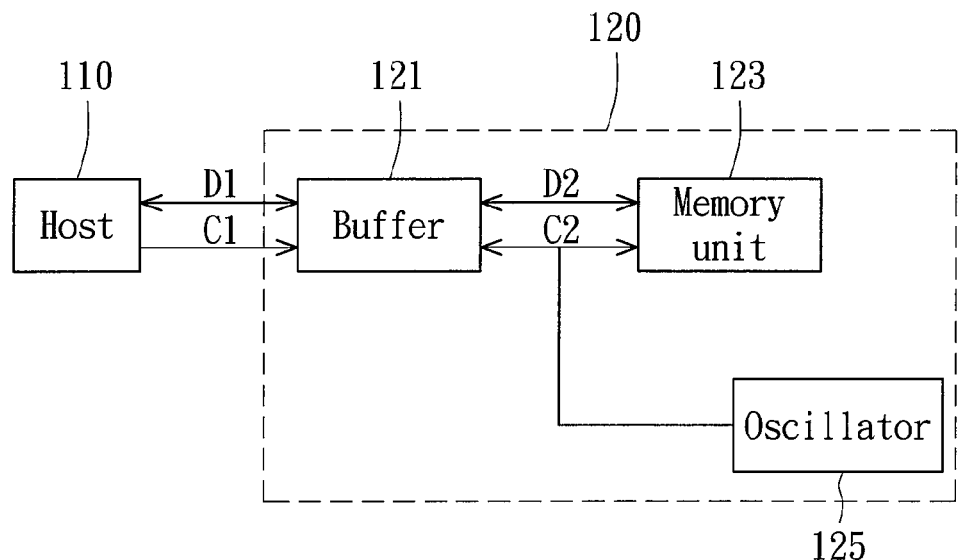
FIG. 1 (Prior Art) illustrates a block diagram of a conventional accessing apparatus and a host.
Figure 2:
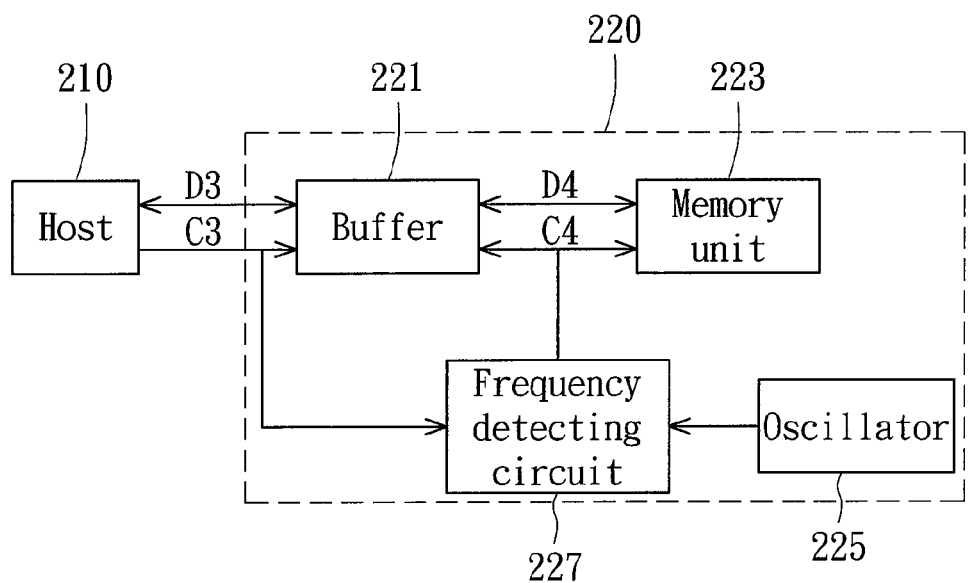
FIG. 2 illustrates a block diagram of an accessing apparatus and a host according to a preferred embodiment of the invention.

Referring to FIG. 2, a block diagram of an accessing apparatus and a host according to a preferred embodiment of the invention is shown. The accessing apparatus 220 transmits an external data D3 with the host 210 by using an external clock C3. The accessing apparatus 220 includes a buffer 221, a memory unit 223, such as a flash memory for storing the internal data D4, an oscillator 225 and a frequency detecting circuit 227. The buffer 221 is used for temporarily storing an internal data D4 or an external data D3 corresponding to the internal data D4. The accessing apparatus 220 accesses the internal data D4 between the buffer 221 and the memory unit 223 according to the internal clock C4. The frequency detecting circuit 227 is used for adjusting the frequency F4 of the internal clock C4 to a corresponding frequency F4' according to the frequency of the external clock C3. The oscillator 225 is used for generating an internal clock C4. Examples of the host 210 include a flash memory read/write apparatus or an apparatus such as digital camera, card reader, PDA (personal digital assistant) or mobile phone capable of accessing a memory card. Examples of the accessing apparatus 220 include a memory card.

When the host 210 is reading/writing the accessing apparatus 220, the host 210 transmits the external data D3 by using the external clock C3 and transmits the external data D3 at an external data bus width B3. Likewise, the accessing apparatus 220 transmits the internal data D4 at an internal data bus width B4. In the present embodiment of the invention, in order to avoid the occurrence of overrun or underrun of the internal clock C4 during the transmission of data, the internal clock C4 should not be operated at a frequency which is too high or too low. The frequency F4 of the internal clock C4 has a corresponding frequency F4' under ideal circumstances. The relationship is expresses as the formula:

$$B3*C3=B4*F4'.$$

When the external clock C3 is at an external high level, the frequency detecting circuit 227 enables the internal clock C4 to be at an internal high level for detecting the number of periods experienced by the external clock to obtain the frequency of the external clock C3. If the frequency F4 of the internal clock C4 is smaller than the corresponding frequency F4', then the frequency detecting circuit 227 increases the frequency F4 of the internal clock C4 to the corresponding frequency F4. If the frequency F4 of the internal clock C4 is larger than the corresponding frequency F4', then the frequency detecting circuit 227 decreases the frequency F4 of the internal clock C4 to the corresponding frequency F4'. For example, when the external clock C3 is 20 MHz and the external data bus width B3 is 1byte, and the internal data bus width B4 is 2byte, then the frequency F4 of the internal clock C4 must be equal to corresponding frequency F4' under ideal circumstances, that is, 10 MHz.

Figure 3:
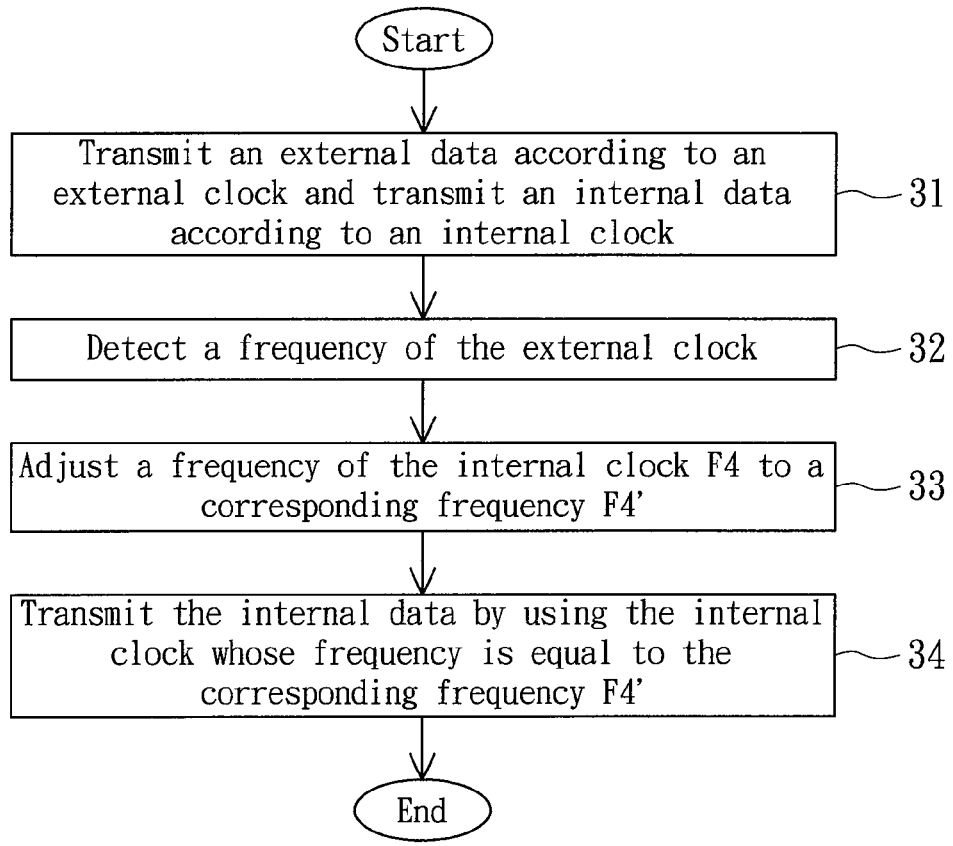
FIG. 3 illustrates a flowchart of an accessing method according to a preferred embodiment of the invention.

Referring to FIG. 3, a flowchart of an accessing method according to a preferred embodiment of the invention is shown. Firstly, the accessing apparatus 220 transmits an external data D3 with the host 210 according to an external clock C3, and transmits an internal data D4 between the buffer 221 and the memory unit 223 according to an internal clock C4 as shown in step 31. Next, a frequency of the external clock C3 is detected as shown in step 32. Next, a corresponding frequency F4' is obtained for adjusting the frequency F4 of the internal clock C4 to a corresponding frequency F4' as shown in step 33. Lastly, the internal data D4 is transmitted between the buffer 221 and the memory unit 223 by using the internal clock C4 whose frequency equals the corresponding frequency F4' as shown in step 34. The internal data or the external data are temporarily stored in the buffer, and the internal data and the external data are corresponding to each other.

Figure 4:
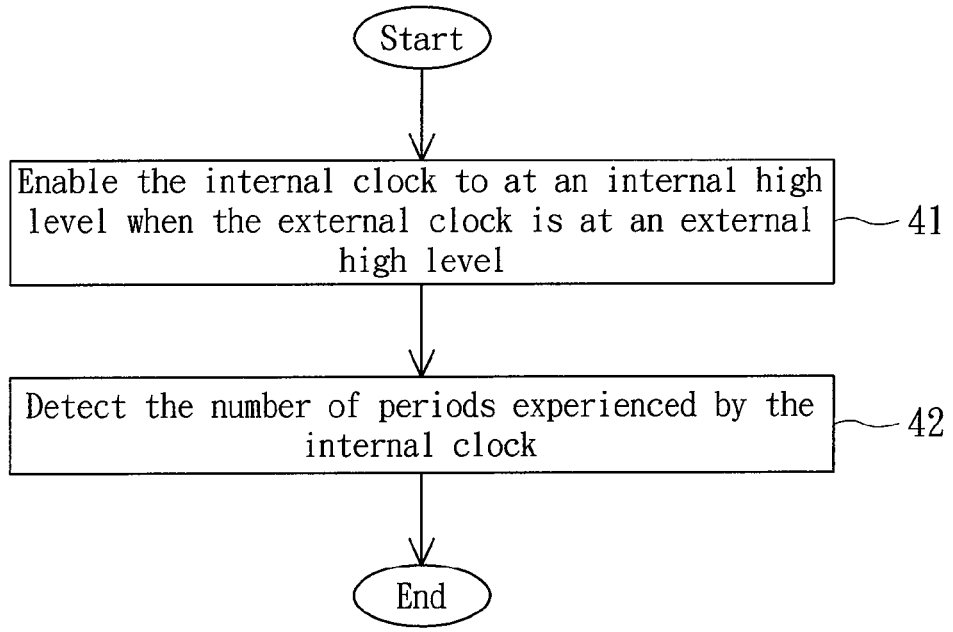
FIG. 4 illustrates a flowchart of detecting an external frequency.
Figure 5:
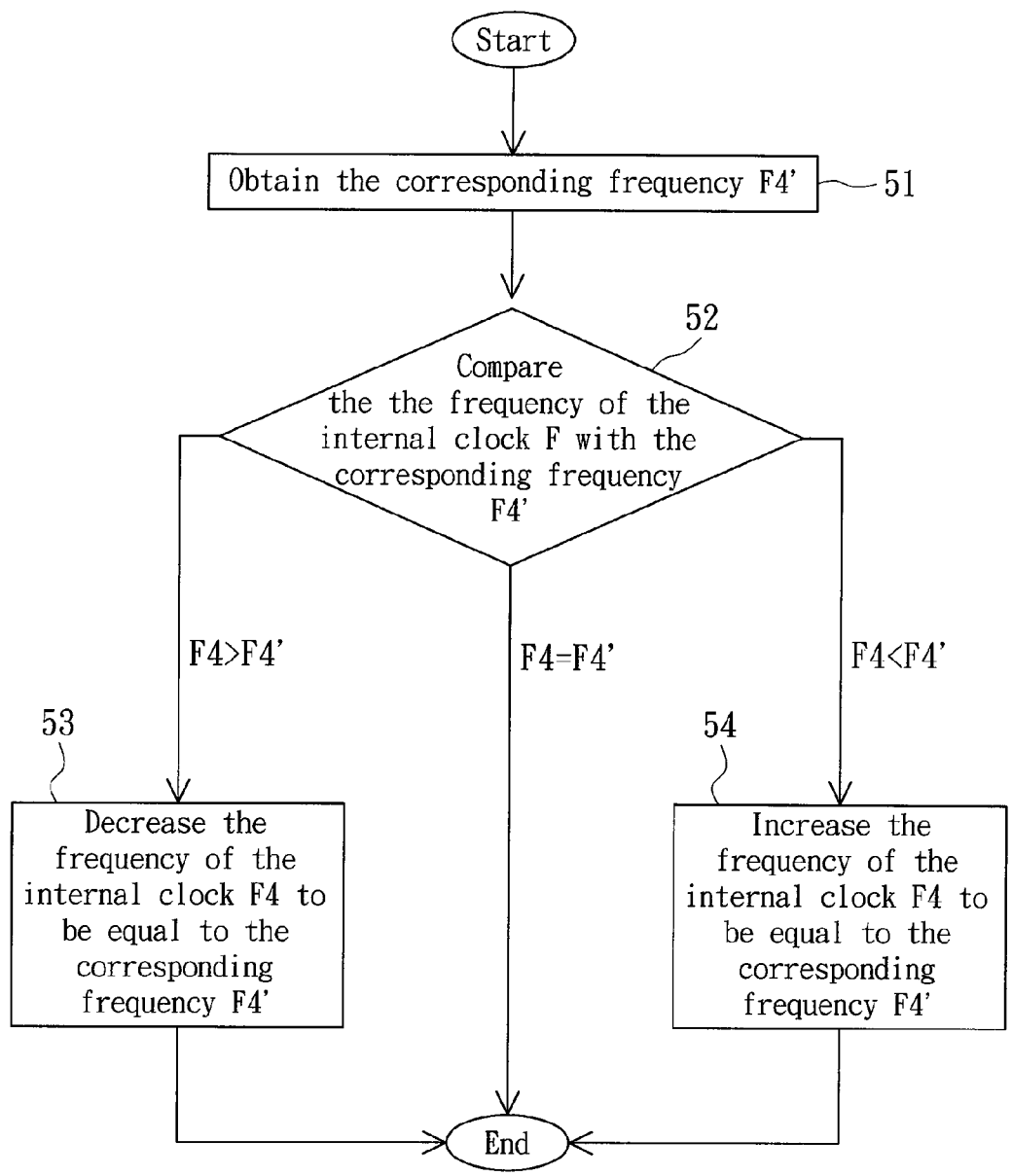
FIG. 5 illustrates a flowchart of adjusting the frequency of an internal clock.

Referring to FIG. 4, a flowchart of detecting an external frequency is shown. FIG. 5 illustrates a flowchart of adjusting the frequency of an internal clock is shown. Firstly, when the external clock C3 is at an external high level, the frequency detecting circuit 227 enables the internal clock C4 to at an internal high level as shown in step 41. Next, when the external clock C3 is at an external high level, the number of periods experienced by the internal clock C4 is detected to obtain the frequency of the external clock C3 as shown in step 42. Referring to FIG. 5, a flowchart of adjusting the frequency of an internal clock is shown. Firstly, the ideal corresponding frequency F4' when the frequency F4 of the internal clock C4 is obtained as shown in step 51. Next, the relationship between the frequency F4 and the corresponding frequency F4 is determined as shown in step 52. if the frequency F4 is equal to the corresponding frequency F4', then the present method is terminated. If the frequency F4 is smaller than the corresponding frequency F4', then the frequency F is increased to the corresponding frequency F4' as shown in step 53. If the frequency F4 is larger than the corresponding frequency F4', then the frequency F4 is decreased to corresponding frequency F4' as shown in step 54.

According to the accessing apparatus and the accessing method thereof disclosed in the above embodiment of the invention, a frequency detecting apparatus is introduced to the accessing apparatus. The frequency of the internal clock is enabled to be adjusted to an ideal corresponding frequency according to the band width of the external clock and the band width of the internal clock, avoiding the occurrence extra power consumption, which occurs when the external clock is unavailable causing the internal clock to operate at the highest frequency. With the application of the portable electronic apparatus, the energy is saved, the battery lifespan is prolonged, and product competitiveness is improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An accessing method of an accessing apparatus and a host, comprising:
    enabling the accessing apparatus to transmit an external data with the host according to an external clock, and transmit an internal data between a buffer and a memory unit of the accessing apparatus according to an internal clock;
    detecting a frequency of the external clock;
    adjusting a frequency of the internal clock to a corresponding frequency according to the frequency of the external clock; and
    transmitting the internal data between the buffer and the memory unit at the corresponding frequency;
    wherein the internal data or the external data are temporarily stored in the buffer, and the internal data and the external data are corresponding to each other.

2. The method according to claim 1, the step of detecting the frequency of the external clock further comprising:
    enabling the internal clock to be at an internal high level when the external clock is at an external high level; and
    detecting the number of periods experienced by the internal clock to obtain the frequency of the external clock when the external clock is at the external high level.

3. The method according to claim 1, the step of adjusting the frequency of the internal clock further comprising:
    obtaining the corresponding frequency by calculating;
    increasing the frequency of the internal clock to equal to the corresponding frequency when the frequency of the internal clock is smaller than the corresponding frequency; and
    decreasing the frequency of the internal clock to equal to the corresponding frequency when the frequency of the internal clock is larger than the corresponding frequency.

4. The method according to claim 3, wherein the external clock is transmitted at an external data bus width, the internal clock is transmitted at an internal data bus width.

5. The method according to claim 4, wherein the corresponding frequency is equal to the external clock multiplied by the external data bus width and then divided by the internal data bus width.

6. The method according to claim 1, wherein the memory unit is a flash memory.

7. The method according to claim 6, wherein the host is a flash memory read/write apparatus.

8. The method according to claim 6, wherein the accessing apparatus is a flash memory card.

9. An accessing apparatus, transmitting an external data with a host by using an external clock and transmitting an internal data inside the accessing apparatus by using an internal clock, the accessing apparatus comprising:
  a buffer for temporarily storing the external data or the internal data, and the internal data corresponding to the external data;
  a memory unit for storing the internal data and transmitting the internal data with the buffer by using an internal clock; and
  a frequency detecting circuit for adjusting the frequency of the internal clock to a corresponding frequency according to the frequency of the external clock;
  wherein the internal data is transmitted between the buffer and the memory unit by using the internal clock whose frequency equals the corresponding frequency.

10. The apparatus according to claim 9, wherein the frequency detecting circuit enables the internal clock to be at an internal high level when the external clock is at an external high level, and the number of periods experienced by the internal clock is detected to obtain the frequency of the external clock.

11. The apparatus according to claim 9, wherein the corresponding frequency is obtained by the frequency detecting circuit.

12. The apparatus according to claim 11, wherein the frequency of the internal clock is increased by the frequency detecting circuit to equal to the corresponding frequency when the frequency of the internal clock is smaller than the corresponding frequency.

13. The apparatus according to claim 11, wherein the frequency of the internal clock is decreased by the frequency detecting circuit to equal to the corresponding frequency when the frequency of the internal clock is larger than the corresponding frequency.

14. The apparatus according to claim 11, wherein the external clock is transmitted at an external data bus width, while the internal clock is transmitted at an internal data bus width;
  wherein the corresponding frequency is equal to the external clock multiplied by the external data bus width and then divided by the internal data bus width.

15. The apparatus according to claim 9, wherein the memory unit is a flash memory.

16. The apparatus according to claim 15, wherein the host is a flash memory read/write apparatus.

17. The apparatus according to claim 15, wherein the accessing apparatus is a flash memory card.

* * * * *